(12) United States Patent
Kanayama

(10) Patent No.: US 7,986,176 B2
(45) Date of Patent: Jul. 26, 2011

(54) CLOCK GENERATING APPARATUS AND CLOCK GENERATING METHOD

(75) Inventor: Yasutaka Kanayama, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 12/724,868

(22) Filed: Mar. 16, 2010

(65) Prior Publication Data

US 2010/0171534 A1 Jul. 8, 2010

Related U.S. Application Data

(63) Continuation of application No. PCT/JP2007/069202, filed on Oct. 1, 2007.

(51) Int. Cl.
*H03L 7/06* (2006.01)

(52) U.S. Cl. ........ 327/156; 327/147; 327/157; 327/158; 327/161; 331/17; 375/375; 375/376

(58) Field of Classification Search .................. 327/156, 327/157, 158; 375/376
See application file for complete search history.

(56) References Cited

U.S. PATENT DOCUMENTS

| 6,873,670 | B1* | 3/2005 | Chiu | 375/375 |
| 7,366,271 | B2* | 4/2008 | Kim et al. | 375/376 |
| 2006/0171496 | A1* | 8/2006 | Nakamuta et al. | 375/376 |

FOREIGN PATENT DOCUMENTS

| JP | 5-110427 A | 4/1993 |
| JP | 2005-150868 A | 6/2005 |
| JP | 2005-244648 A | 9/2005 |
| JP | 2006-217203 A | 8/2006 |
| JP | 2007-27809 A | 2/2007 |

OTHER PUBLICATIONS

International Search Report of PCT/JP2007/069202, mailing date of Nov. 27, 2007.

* cited by examiner

*Primary Examiner* — Lincoln Donovan
*Assistant Examiner* — John W Poos
(74) *Attorney, Agent, or Firm* — Westerman, Hattori, Daniels & Adrian, LLP

(57) ABSTRACT

A clock generating apparatus includes a phase-difference measuring device for measuring a difference in phase between a reference clock and a feedback clock generated by a divider with a high-speed clock generated by a multiplier, an averager for averaging the measured phase difference, and an output clock generator for returning a self-generated output clock to the multiplier and the divider and generating an output clock synchronized with the reference clock by using the averaged phase difference and a generated operation clock. The multiplier generates the high-speed clock by multiplying the returned output clock, and the divider generates the feedback clock by dividing the returned output clock A frequency of generation of the output clock in the output clock generator is increased.

12 Claims, 7 Drawing Sheets

CLOCK GENERATING APPARATUS AND CLOCK GENERATING METHOD

CROSS-REFERENCE TO RELATED APPLICATION

This application is a continuation of International Application No. PCT/JP2007/069202, filed on Oct. 1, 2007, the entire contents of which are incorporated herein by reference.

FIELD

The embodiments discussed herein are directed to a clock generating apparatus and a clock generating method.

BACKGROUND

Conventional cesium atomic oscillators and rubidium atomic oscillators have been developed. These oscillators are used to generate a highest-level reference clock, which is a reference clock at a highest level, and are also used in GPS (Global Positioning System) to generate and transmit a 1PPS (1 pulse per second) signal, which is a reference clock generated based on the highest-level reference clock. Furthermore, there has been provided a clock generating apparatus (e.g., a PLL (Phase Locked Loop) circuit) for generating an output clock used by a device in a digital synchronous network by synchronizing a 1PPS signal transmitted from a GPS and an operation clock generated by an internal high-precision oscillator (see Japanese Laid-open Patent Publication No. 2005-244648, Japanese Laid-open Patent Publication No. 2006-217203 and Japanese Laid-open Patent Publication No. 2007-27809).

An overview of a conventional clock generating apparatus is explained here with reference to FIG. 8. FIG. 8 is a diagram for explaining the overview of a conventional clock generating apparatus. Incidentally, it will be assumed that an output clock synchronized with a 1PPS signal is generated by the conventional clock generating apparatus composed of a phase comparator (e.g., a DPD: digital phase detector), a loop filter (e.g., a DLF: digital loop filter), an oscillator (e.g., a DDS: direct digital synthesizer), a multiplier (e.g., an analog PLL circuit), a divider, and an internal high-precision oscillator.

When receiving a 1PPS signal (see (1) in FIG. 8), the phase comparator of the conventional clock generating apparatus measures the difference in phase between both the 1PPS signal and a feedback clock with a high-speed clock (see (2) in FIG. 8). The high-speed clock here means a clock obtained from an output clock previously generated by the clock generating apparatus by being multiplied by the multiplier (see (3) in FIG. 8). The feedback clock here means a clock obtained from an output clock previously generated by the clock generating apparatus by being divided by the divider (see (4) in FIG. 8).

Next, the loop filter of the conventional clock generating apparatus averages the phase difference measured by the phase comparator (see (5) in FIG. 8).

Then, the oscillators of the conventional clock generating apparatus generate an output clock of a new frequency synchronized with the 1PPS signal (see (7) in FIG. 8) by using an operation clock generated by the internal high-precision oscillator (see (6) in FIG. 8) and the averaged phase difference averaged by the loop filter. The output clock of the new frequency is then returned to the multiplier and the divider (see (8) in FIG. 8).

In this manner, the conventional clock generating apparatus feeds back an output clock thereby generating an output clock synchronized with a 1PPS signal.

However, the conventional technology described above has a problem in that the operation of other devices in a digital synchronous network may be adversely affected.

Namely, in a process of generating a new output clock with a difference in phase between a reference clock and an output clock, for example, if the reference clock is a 1PPS signal, the conventional oscillator generates an output clock of a new frequency every 1 second (see (A) in FIG. 8). At this time, in the conventional technologies, an output clock with a frequency that greatly fluctuates is generated; thus, the operation of other devices in the digital synchronous network that uses this output clock are adversely affected.

SUMMARY

According to an aspect of an embodiment of the invention, a clock generating apparatus includes a phase-difference measuring device that measures a difference in phase between a reference clock and a feedback clock generated by a divider by using a high-speed clock multiplied by a multiplier; an averager that averages the phase difference measured by the phase-difference measuring device; and an output clock generator that returns a self-generated output clock to the multiplier and the divider and generates an output clock synchronized with the reference clock by using the phase difference averaged by the averager and an operation clock generated by an internal high-precision oscillator. The multiplier generates the high-speed clock by multiplying the output clock returned from the output clock generator, and the divider generates the feedback clock by dividing the output clock returned from the output clock generator. The clock generating apparatus for generating an output clock synchronized with the reference clock, further includes a first frequency increasing unit that increases a frequency of generation of the output clock in the output clock generator.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT(S)

Preferred embodiments of the present invention will be explained with reference to accompanying drawings. In what follows, a clock generating apparatus (e.g., a clock generating apparatus (a PLL circuit) for generating a reference clock in an optical communication apparatus or a mobile communication apparatus) according to the present invention is explained as an embodiment.

[a] First Embodiment

In what follows, an overview and characteristics of a clock generating apparatus according to a first embodiment, a configuration of the clock generating apparatus, and a flow of a process performed by the clock generating apparatus are explained in this order, and the advantageous effect of the first embodiment is explained at the end.

Figure 1:
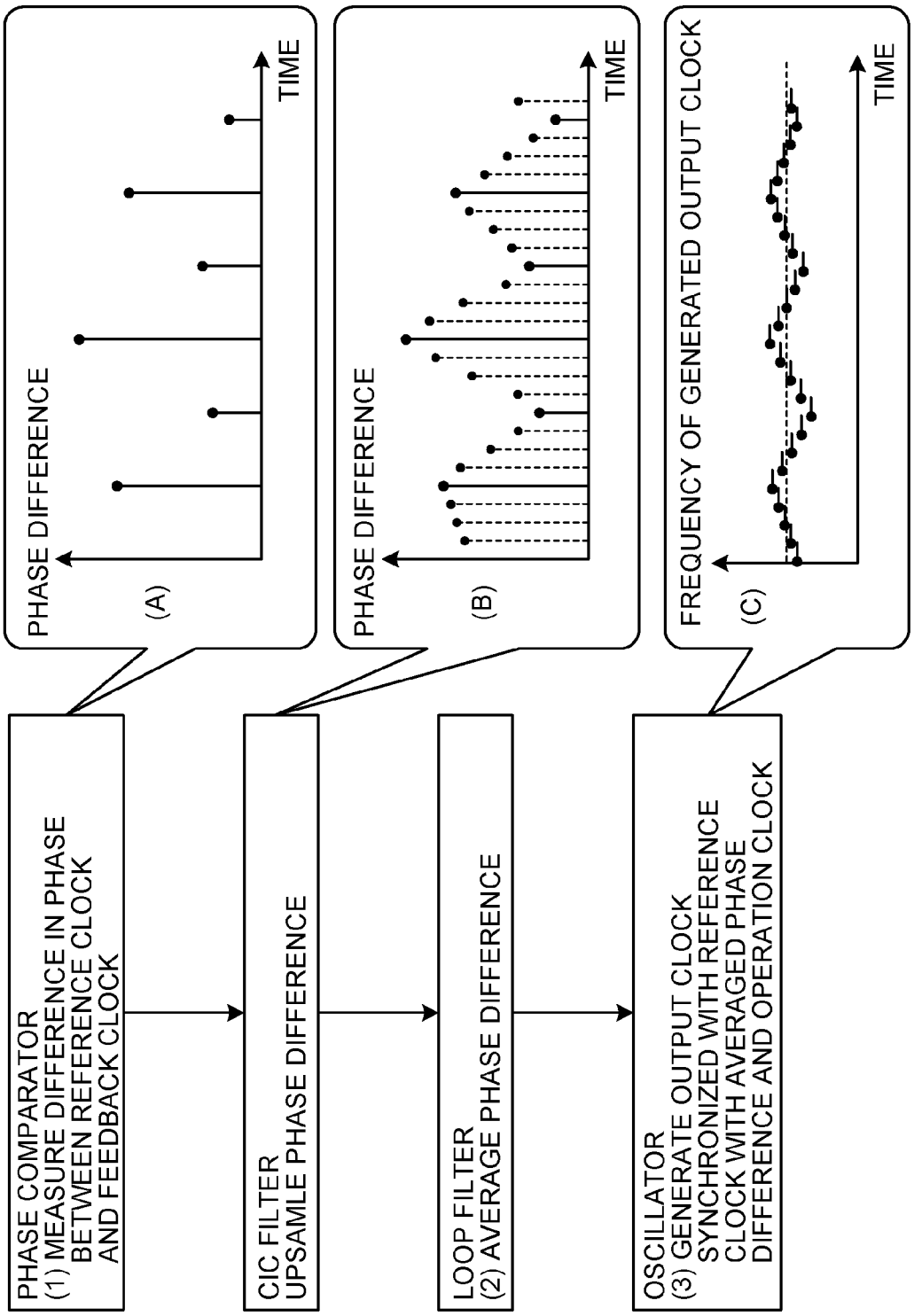
FIG. 1 is a diagram for explaining an overview and characteristics of a clock generating apparatus according to a first embodiment.

Overview and Characteristics of the Clock Generating Apparatus According to the First Embodiment At first, an overview and characteristics of the clock generating apparatus according to the first embodiment are explained with reference to FIG. 1. FIG. 1 is a diagram for explaining the overview and characteristics of the clock generating apparatus according to the first embodiment.

The clock generating apparatus according to the first embodiment is composed of a phase comparator for measuring a phase difference, a loop filter for averaging the phase difference, an oscillator for generating an output clock, a multiplier for multiplying the output clock, a divider for dividing the output clock, and an internal high-precision oscillator for generating an operation clock, and the overview of the clock generating apparatus according to the first embodiment is to generate an output clock synchronized with a 1PPS signal.

The clock generating apparatus according to the first embodiment further includes a CIC (Cascade Integrate Comb) filter, which is provided in between the phase comparator and the loop filter, and main characteristics of the clock generating apparatus according to the first embodiment is to upsample a phase difference with the CIC filter thereby increasing a frequency of generation of an output clock in the oscillator. This allows the clock generating apparatus according to the first embodiment to generate an output clock without causing a frequency of the output clock to fluctuate a lot.

Specifically, the phase comparator of the clock generating apparatus according to the first embodiment measures a difference in phase between a reference clock and a feedback clock generated by the divider with a high-speed clock generated by the multiplier (see (1) in FIG. 1). Subsequently, the loop filter or averager of the clock generating apparatus according to the first embodiment averages the phase difference (see (2) in FIG. 1). Then, the oscillator of the clock generating apparatus according to the first embodiment generates an output clock synchronized with the reference clock with the averaged phase difference and the operation clock (see (3) in FIG. 1).

In this case, the CIC filter of the clock generating apparatus according to the first embodiment upsamples the phase difference measured by the phase comparator thereby increasing a frequency of input of the phase difference input from the phase comparator to the loop filter, and thus a frequency of input of the averaged phase difference input from the loop filter to the oscillator is increased, and a frequency of generation of the output clock in the oscillator is increased.

In the conventional technology, an averaged phase difference input to the oscillator is every 1 second; however, the clock generating apparatus according to the first embodiment converts a phase difference measured every 1 second (see (A) in FIG. 1) into a phase difference every 0.25 second (see (B) in FIG. 1), thereby shortening a period of the averaged phase difference input to the oscillator to 0.25 second, and generates an output clock of a new frequency every 0.25 second (see (C) in FIG. 1).

In this manner, the clock generating apparatus according to the first embodiment upsamples the phase difference with the CIC filter thereby increasing the frequency of generation of the output clock in the oscillator; thus, the clock generating apparatus according to the first embodiment can generate an output clock without causing a frequency of the output clock to fluctuate a lot.

Figure 2:
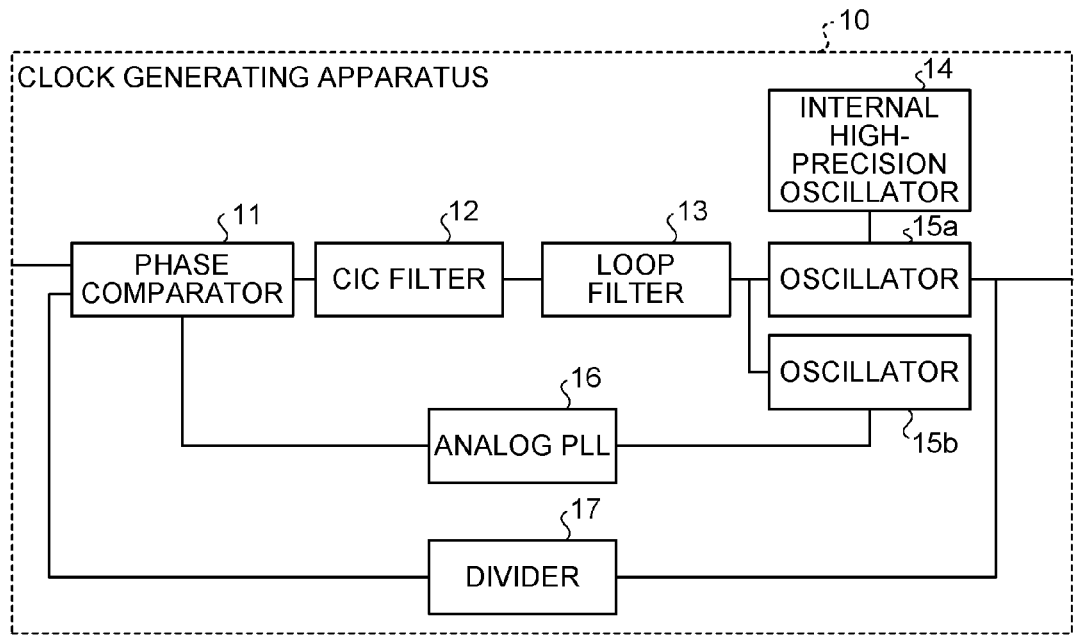
FIG. 2 is a block diagram illustrating a configuration of the clock generating apparatus according to the first embodiment.

Configuration of the Clock Generating Apparatus According to the First Embodiment Subsequently, a configuration of a clock generating apparatus 10 is explained with reference to FIG. 2. FIG. 2 is a block diagram illustrating the configuration of the clock generating apparatus according to the first embodiment. As illustrated in FIG. 2, the clock generating apparatus 10 is composed of a phase comparator 11, a CIC filter 12, a loop filter 13, an internal high-precision oscillator 14, oscillators 15a and 15b, an analog PLL 16, and a divider 17.

When receiving a reference clock, the phase comparator 11 measures a difference in phase between the reference clock and a feedback clock. Specifically, when receiving a 1PPS signal, which is a higher-level reference clock, from a GPS via an antenna (not illustrated), the phase comparator 11 measures a difference in phase between the 1PPS signal and a feedback clock with a high-speed clock, and outputs the phase difference as a result of the measurement to the CIC filter 12.

The high-speed clock here means a clock obtained in such a way that an output clock previously generated by the oscillators 15a and 15b is multiplied by the analog PLL 16. The feedback clock here means a clock obtained in such a way that an output clock previously generated by the oscillators 15a and 15b is divided by the divider 17. Incidentally, the phase comparator 11 corresponds to a phase-difference measuring device of the invention.

The CIC filter 12 upsamples the phase difference measured by the phase comparator 11 to increase a frequency of input of the phase difference input from the phase comparator 11 to the loop filter 13. Specifically, the CIC filter 12 corresponds to an upsampling filter (e.g., a digital CIC filter), and converts (i.e., upsamples) the phase difference received from the phase comparator 11, which is expressed in discrete values per 1 second, into a phase difference expressed in discrete values per 1/L second, thereby shortening a period of the phase difference input to the loop filter 13 to 1/L second.

The term "L" here means a constant defined by a property that the CIC filter 12 has, and for example, if the CIC filter 12 has a property of converting a 1PPS signal into a 5PPS signal, "L" equals "5". Incidentally, the CIC filter 12 corresponds to a first frequency increasing unit of the invention.

The loop filter 13 averages a phase difference. Specifically, the loop filter 13 corresponds to a low-pass filter, and averages the phase difference received from the CIC filter 12 by filtering the phase difference. The averaged phase difference here is a signal for causing the oscillators 15a and 15b to generate an output clock of a new frequency. Incidentally, the loop filter 13 corresponds to an averager of the invention.

The internal high-precision oscillator 14 generates an operation clock. Specifically, the internal high-precision oscillator 14 generates an operation clock, which is a clock for operating the oscillators 15a and 15b, and outputs the operation clock to the oscillators 15a and 15b.

The oscillators 15a and 15b generate an output clock synchronized with the reference clock. Specifically, each time the oscillator 15a receives the averaged phase difference from the loop filter 13, the oscillator 15a generates an output clock synchronized with the reference clock with the averaged phase difference and the operation clock generated by the internal high-precision oscillator 14. The oscillator 15b returns the output clock generated by the oscillator 15a to the analog PLL 16 and the divider 17. Incidentally, the oscillators 15a and 15b correspond to an output clock generator of the invention.

The analog PLL 16 generates a high-speed clock by multiplying the output clock returned from the oscillators 15a and 15b, and outputs the high-speed clock to the phase comparator 11. Incidentally, the analog PLL 16 corresponds to a multiplier of the invention.

The divider 17 generates a feedback clock by dividing the output clock returned from the oscillators 15a and 15b, and outputs the feedback clock to the phase comparator 11. Incidentally, the divider 17 corresponds to a divider of the invention.

Process by the Clock Generating Apparatus According to the First Embodiment

Figure 3:
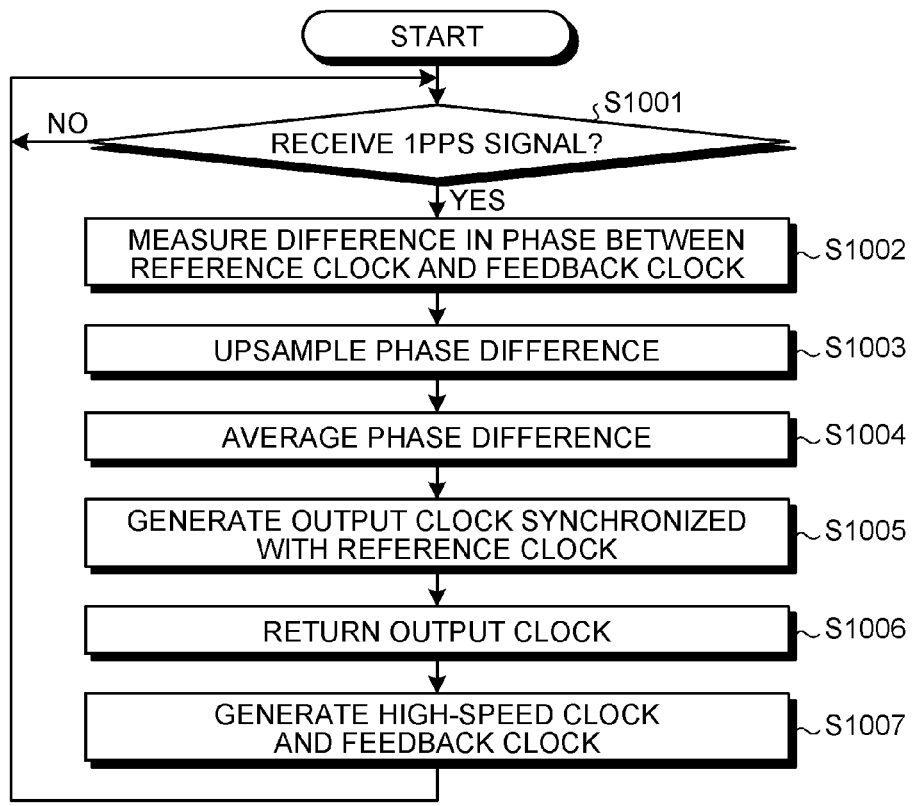
FIG. 3 is a flowchart illustrating a flow of a process performed by the clock generating apparatus according to the first embodiment.

Subsequently, a process performed by the clock generating apparatus 10 is explained with reference to FIG. 3. FIG. 3 is a flowchart illustrating a flow of a process performed by the clock generating apparatus according to the first embodiment. Incidentally, the process to be explained below is repeatedly executed while the clock generating apparatus 10 is activated, and terminated when the clock generating apparatus 10 is shut down.

As illustrated in FIG. 3, when receiving a 1PPS signal (YES at Step S1001), the clock generating apparatus 10 measures a difference in phase between the reference clock and a feedback clock (Step S1002).

Then, the clock generating apparatus 10 upsamples the phase difference measured by the phase comparator 11 (Step S1003), and averages the phase difference (Step S1004).

Then, the clock generating apparatus 10 generates an output clock synchronized with the reference clock with the averaged phase difference and an operation clock (Step S1005), and returns the generated output clock to the analog PLL 16 and the divider 17 (Step S1006).

Then, the clock generating apparatus 10 generates a high-speed clock by multiplying the returned output clock and generates a feedback clock by dividing the returned output clock (Step S1007), and again waits for a 1PPS signal (Step S1001).

Advantageous Effect of the First Embodiment

As described above, according to the first embodiment, a frequency of generation of an output clock in the oscillators 15a and 15b is increased; thus, it is possible to generate an output clock without causing a frequency of the output clock to fluctuate a lot.

Furthermore, according to the first embodiment, a phase difference measured by the phase comparator 11 is upsampled to increase a frequency of input of the phase difference input from the phase comparator 11 to the loop filter 13, and thus a frequency of generation of an output clock in the oscillators 15a and 15b is increased; as a result, it is possible to generate an output clock without causing a frequency of the output clock to fluctuate a lot.

Moreover, according to the first embodiment, a phase difference measured by the phase comparator 11 is upsampled by the CIC filter 12, thus the present invention can be easily achieved.

[b] Second Embodiment

In the clock generating apparatus 10 according to the first embodiment described above, the CIC filter 12 is provided in between the phase comparator 11 and the loop filter 13, and a phase difference is upsampled by the CIC filter 12; however, the present invention is not limited to this. Alternatively, the CIC filter 12 can be provided in between the loop filter 13 and the oscillators 15a and 15b so as to upsample an averaged phase difference.

In a second embodiment below, a case where it is configured that the CIC filter 12 is provided in between the loop filter 13 and the oscillators 15a and 15b is explained. Incidentally, in the second embodiment, after a configuration of the clock generating apparatus 10 according to the second embodiment is explained, the advantageous effect of the second embodiment is explained.

Figure 4:
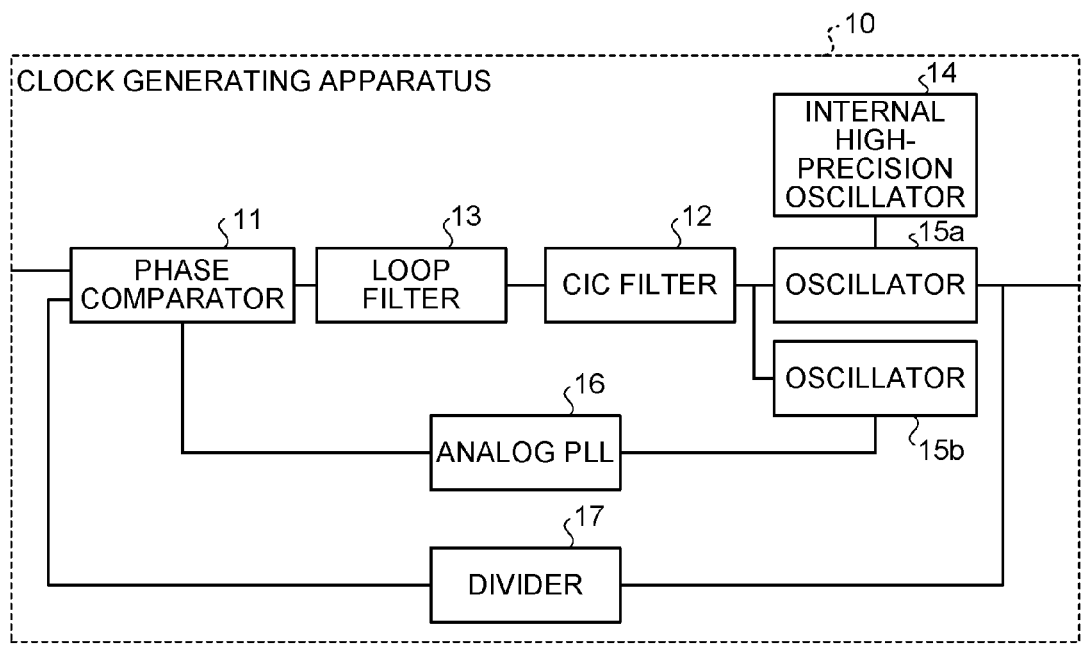
FIG. 4 is a block diagram illustrating a configuration of a clock generating apparatus according to a second embodiment.

Configuration of the Clock Generating Apparatus 10 According to the Second Embodiment First, a configuration of the clock generating apparatus 10 according to the second embodiment is explained with reference to FIG. 4. FIG. 4 is a block diagram illustrating the configuration of the clock generating apparatus according to the second embodiment. The configuration of the clock generating apparatus 10 according to the second embodiment differs from that of the clock generating apparatus 10 according to the first embodiment in the following points.

The phase comparator 11 outputs a measured phase difference to the loop filter 13, and the loop filter 13 averages the phase difference.

The CIC filter 12 upsamples the phase difference averaged by the loop filter 13 thereby increasing a frequency of input of the phase difference input from the loop filter 13 to the oscillators 15a and 15b.

Each time the oscillators 15a and 15b receive the averaged phase difference from the CIC filter 12, the oscillators 15a and 15b generate an output clock synchronized with the reference clock with the averaged phase difference and an operation clock generated by the internal high-precision oscillator 14.

Advantageous Effect of the Second Embodiment

As described above, according to the second embodiment, a phase difference averaged by the loop filter 13 is upsampled to increase a frequency of input of the phase difference input from the loop filter 13 to the oscillators 15a and 15b, and thus a frequency of generation of an output clock in the oscillators 15a and 15b is increased; as a result, it is possible to generate an output clock without causing a frequency of the output clock to fluctuate a lot.

[c] Third Embodiment

In the above first and second embodiments, a case where the reference clock input to the phase comparator 11 is a 1PPS signal is explained; alternatively, a frequency of input of the reference clock input to the phase comparator 11 can be increased by converting a frequency of the reference clock.

In a third embodiment below, a case where a 1PPS signal input to the phase comparator 11 of the clock generating apparatus 10 according to the first embodiment is upsampled is explained. Incidentally, in the third embodiment, after a configuration and a processing flow of the clock generating apparatus 10 according to the third embodiment are explained, the advantageous effect of the third embodiment is explained.

Figure 5:
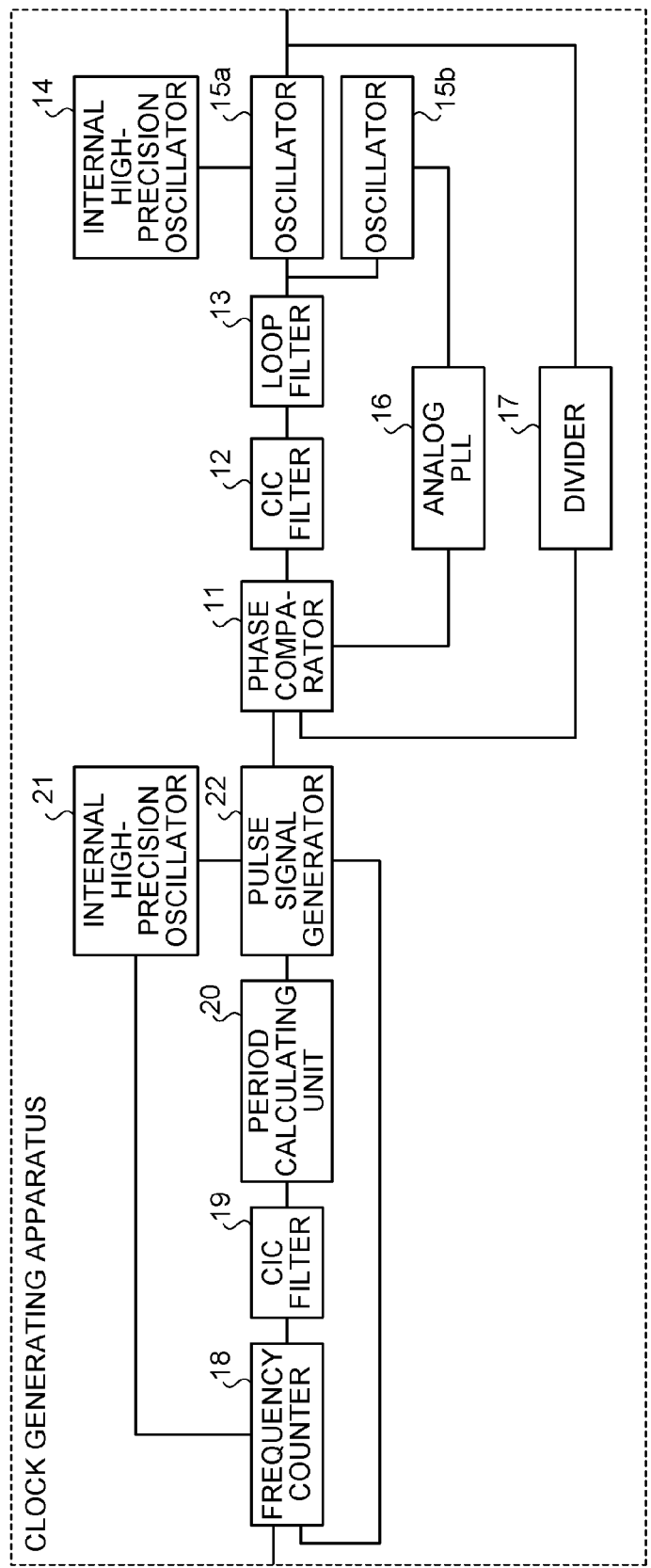
FIG. 5 is a block diagram illustrating a configuration of a clock generating apparatus according to a third embodiment.

Configuration of the Clock Generating Apparatus 10 According to the Third Embodiment First, a configuration of the clock generating apparatus 10 is explained with reference to FIG. 5. FIG. 5 is a block diagram illustrating the configuration of the clock generating apparatus according to the third embodiment. The configuration of the clock generating apparatus 10 according to the third embodiment differs from that of the clock generating apparatus 10 according to the first embodiment in the following points.

As illustrated in FIG. 5, the clock generating apparatus 10 according to the third embodiment further includes a frequency counter 18, a CIC filter 19, a period calculating unit 20, an internal high-precision oscillator 21, and a pulse signal generator 22.

The frequency counter 18 converts a period of a reference clock into a period of an operation clock generated by the internal high-precision oscillator 21. Specifically, when receiving a 1PPS signal, which is a higher-level reference clock, from a GPS via an antenna (not illustrated), the frequency counter 18 converts a period of the 1PPS signal with an operation clock, and outputs a result of conversion to the CIC filter 19. Incidentally, the frequency counter 18 corresponds to a period converting unit of the invention.

The CIC filter 19 upsamples the result of conversion by the frequency counter 18 to increase a frequency of input of the result of conversion input from the frequency counter 18 to the period calculating unit 20 to a predetermined constant multiple. Specifically, the CIC filter 19 has the same configuration as the CIC filter 12 according to the first embodiment, and converts (i.e., upsamples) the result of conversion received from the frequency counter 18, which is expressed in discrete values per 1 second, into a result of conversion expressed in discrete values per 1/M second, thereby shortening a period of the result of conversion input from the frequency counter 18 to the period calculating unit 20 to 1/M second.

The term "M" here, in the same manner as "L" according to the CIC filter 12, means a constant defined by a property that the CIC filter 19 has. Incidentally, the CIC filter 19 corresponds to a second frequency increasing unit of the invention.

The period calculating unit 20 calculates a period of a new reference clock by dividing the result of conversion of which the frequency of input is increased by the CIC filter 19 by a predetermined constant. Specifically, the period calculating unit 20 calculates a period of a new reference clock by dividing the result of conversion of which the frequency is increased by a constant "M". Namely, the result of conversion corresponding to "1 second" is divided by the constant "M", and a period of a reference clock corresponding to "1/M second" is calculated.

The internal high-precision oscillator 21 has the same configuration as the internal high-precision oscillator 14 according to the first embodiment, and generates an operation clock and outputs the operation clock to the frequency counter 18 and the pulse signal generator 22.

The pulse signal generator 22 generates a pulse signal from the operation clock generated by the internal high-precision oscillator 21 with each period of the new reference clock calculated by the period calculating unit 20. Specifically, the pulse signal generator 22 measures a period of the operation clock generated by the internal high-precision oscillator 21, generates a pulse signal each time the measured period of the operation clock reaches the period of the new reference clock, and outputs the pulse signal as a new reference clock to the phase comparator 11.

For example, if a period of a reference clock corresponding to "1/M second" is calculated by the period calculating unit 20, the pulse signal generator 22 generates a pulse signal every "1/M second". In other words, the pulse signal generator 22 generates a reference clock corresponding to an "M"PPS signal, and outputs the reference clock as a new reference clock to the phase comparator 11.

Namely, if the CIC filter 19 has a property of converting a 1PPS signal into an "M"PPS signal, and the CIC filter 12 has a property of converting a 1PPS signal into an "L"PPS signal, a frequency of generation of an output clock in the oscillators 15a and 15b is increased by "M*L"-fold (* denotes "multiplied by").

Process by the Clock Generating Apparatus According to the Third Embodiment

Figure 6:
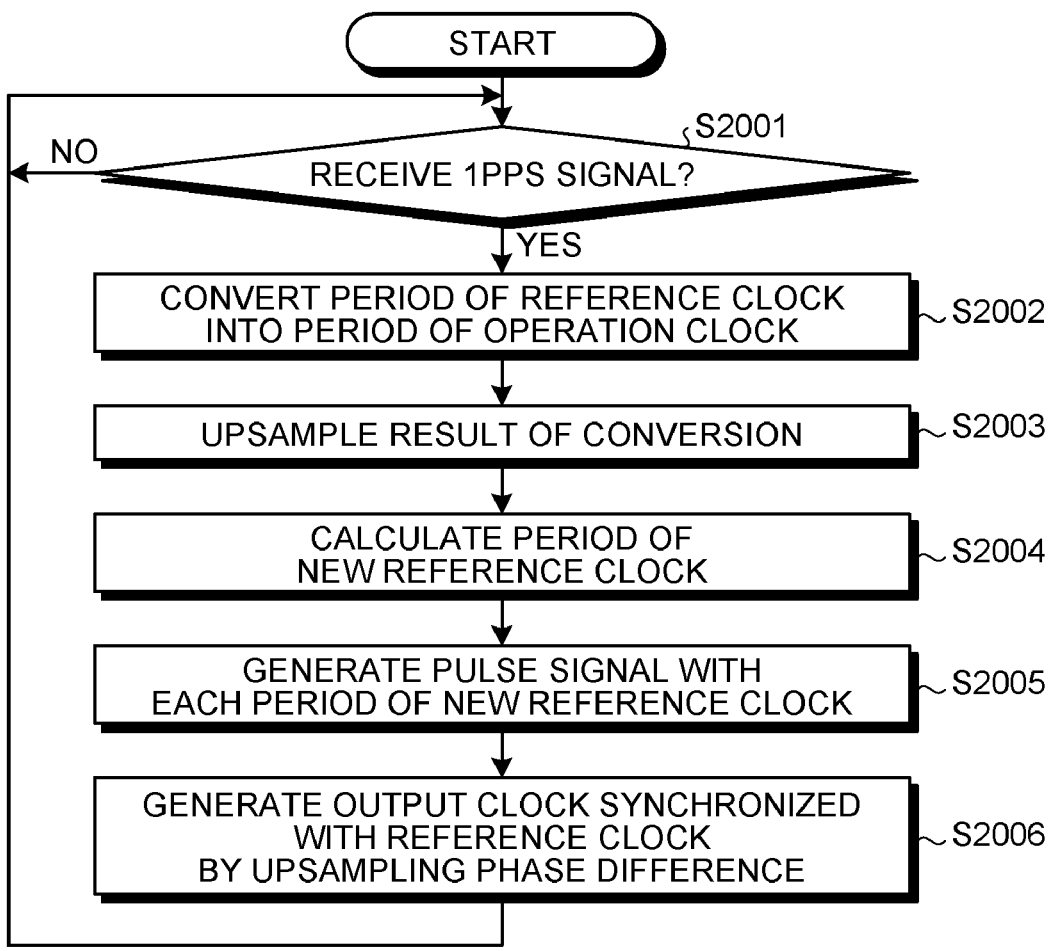
FIG. 6 is a flowchart illustrating a flow of a process performed by the clock generating apparatus according to the third embodiment.

Subsequently, a process performed by the clock generating apparatus 10 is explained with reference to FIG. 6. FIG. 6 is a flowchart illustrating a flow of a process performed by the clock generating apparatus according to the third embodiment. Incidentally, in what follows, a flow of a process from when the clock generating apparatus according to the third embodiment receives a 1PPS signal until when the clock generating apparatus generates a pulse signal is explained in detail. After that, the clock generating apparatus according to the third embodiment shall generate an output clock synchronized with the reference clock by upsampling a phase difference in the same manner as in the first embodiment (see Steps S1002 to S1007 in FIG. 3).

As illustrated in FIG. 6, when receiving a 1PPS signal (YES at Step S2001), the clock generating apparatus 10 converts a period of the reference clock into a period of an operation clock generated by the internal high-precision oscillator 21 (Step S2002).

Then, the clock generating apparatus 10 upsamples a result of conversion by the frequency counter 18 (Step S2003), and calculates a period of a new reference clock (Step S2004).

Then, the clock generating apparatus 10 generates a pulse signal from the operation clock generated by the internal high-precision oscillator 21 with each period of the new reference clock calculated by the period calculating unit 20 (Step S2005).

Then, the clock generating apparatus 10 generates an output clock synchronized with the reference clock by upsampling a phase difference (Step S2006), and again waits for a 1PPS signal (Step S2001).

Advantageous Effect of the Third Embodiment

As described above, according to the third embodiment, a period of a reference clock is converted into a period of an operation clock generated by the internal high-precision oscillator 21, a result of conversion is upsampled, a period of a new reference clock is calculated, and a pulse signal is generated from the operation clock with each period of the new reference clock, and thus a frequency of input of the reference clock input to the phase comparator 11 is increased;

as a result, it is possible to generate an output clock with an amount of fluctuation in frequency of the output clock further reduced.

[d] Fourth Embodiment

In the clock generating apparatus 10 according to the third embodiment, the CIC filter 19 is provided in between the frequency counter 18 and the period calculating unit 20, and a result of conversion by the frequency counter 18 is upsampled by the CIC filter 19; however, the present invention is not limited to this. Alternatively, the CIC filter 19 can be provided in between the period calculating unit 20 and the pulse signal generator 22 so as to upsample a period of a new reference clock calculated by the period calculating unit 20.

In a fourth embodiment below, a case where it is configured that the CIC filter 19 is provided in between the period calculating unit 20 and the pulse signal generator 22 is explained. Incidentally, in the fourth embodiment, after a configuration of the clock generating apparatus 10 according to the fourth embodiment is explained, the advantageous effect of the fourth embodiment is explained.

Figure 7:
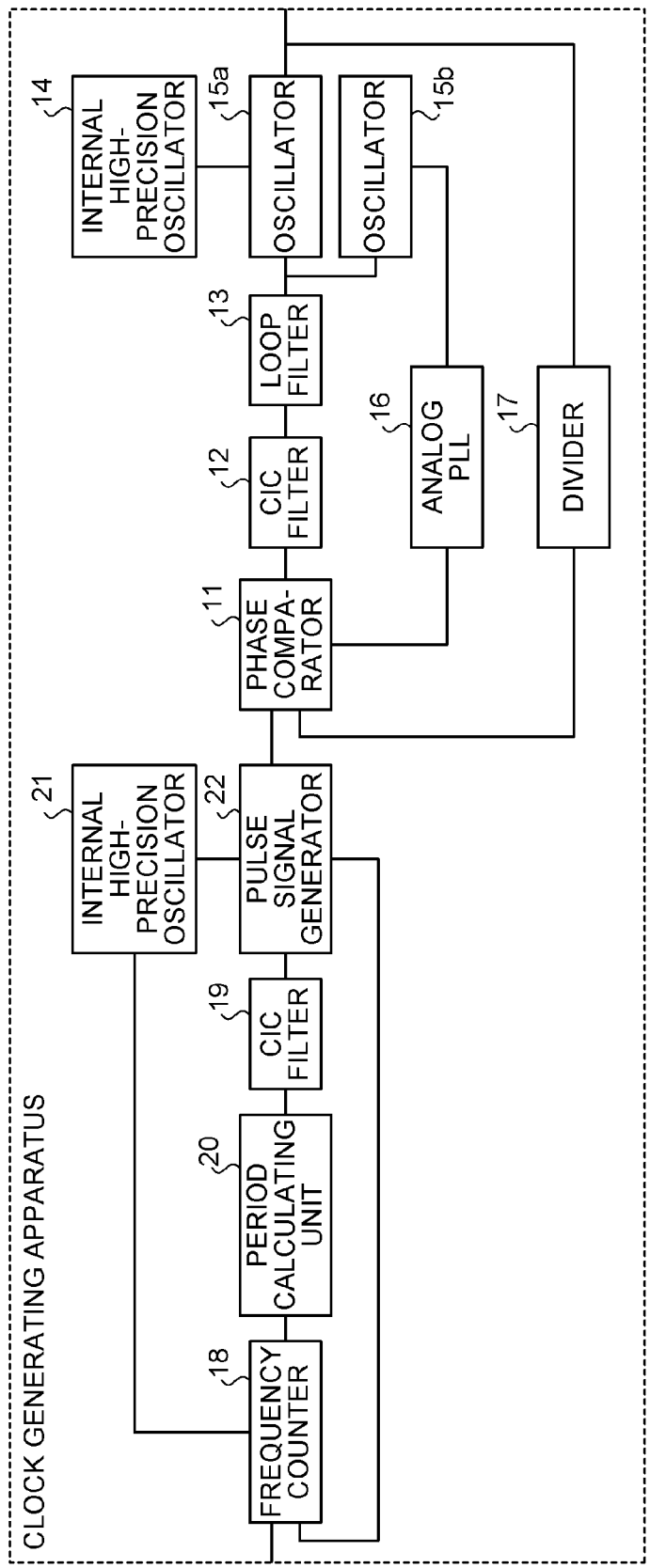
FIG. 7 is a block diagram illustrating a configuration of a clock generating apparatus according to a fourth embodiment.
Figure 8:
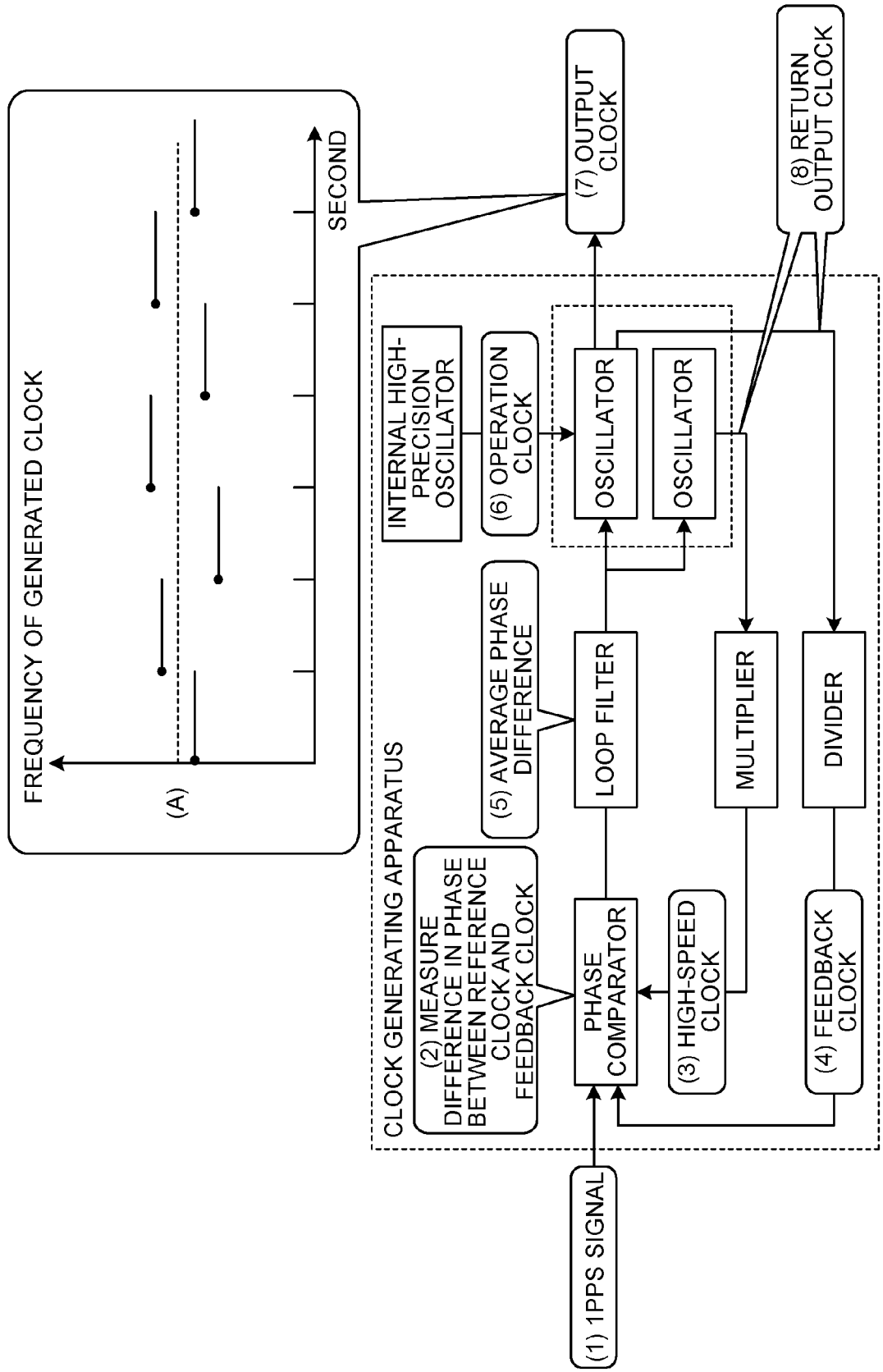
FIG. 8 is a diagram for explaining an overview of a conventional clock generating apparatus.

Configuration of the Clock Generating Apparatus 10 According to the Fourth Embodiment First, a configuration of the clock generating apparatus 10 according to the fourth embodiment is explained with reference to FIG. 7. FIG. 7 is a block diagram illustrating the configuration of the clock generating apparatus according to the fourth embodiment. The configuration of the clock generating apparatus 10 according to the fourth embodiment differs from that of the clock generating apparatus 10 according to the third embodiment in the following points.

The frequency counter 18 converts a period of a 1PPS signal with an operation clock, and outputs a result of conversion to the period calculating unit 20.

The period calculating unit 20 divides the result of conversion by the frequency counter 18 by a predetermined constant, and calculates a period of a new reference clock.

The CIC filter 19 upsamples the period of the new reference clock calculated by the period calculating unit 20 to increase a frequency of input of the new reference clock input from the period calculating unit 20 to the pulse signal generator 22 to a predetermined constant multiple.

The pulse signal generator 22 generates a pulse signal from an operation clock generated by the internal high-precision oscillator 21 with each period of the new reference clock calculated by the period calculating unit 20 based on the period of the new reference clock of which the frequency of input is increased by the CIC filter 19.

Advantageous Effect of the Fourth Embodiment

As described above, according to the fourth embodiment, a period of a reference clock is converted into a period of an operation clock generated by the internal high-precision oscillator 21, a period of a new reference clock is calculated, the period of the new reference clock is upsampled, and a pulse signal is generated from the operation clock with each period of the new reference clock, and thus a frequency of input of the reference clock input to the phase comparator 11 is increased; as a result, it is possible to generate an output clock with an amount of fluctuation in frequency of the output clock further reduced.

[e] Fifth Embodiment

The first to fourth embodiments are explained above, but the present invention can be embodied in various different forms other than the embodiments described above. In what follows, as a fifth embodiment, another embodiment is explained.

For example, the present invention can be applied to a transmission clock generating apparatus for generating a transmission clock used in a transmission network, such as an SDH (Synchronous Digital Hierarchy) or a SONET (Synchronous Optical NETwork), so that the transmission clock generating apparatus distributes a generated output clock to an electronic apparatus connected via the transmission network.

Furthermore, the present invention can be applied to an electronic apparatus equipped with a GPS receiver or a GPS module so that the electronic apparatus performs each process with a generated output clock.

It is explained in the third and fourth embodiments that the frequency counter 18, the CIC filter 19, the period calculating unit 20, the internal high-precision oscillator 21, and the pulse signal generator 22 are further provided; however, the present invention is not limited to this. The present invention can be applied to any apparatus if the apparatus converts a frequency of a reference clock thereby increasing a frequency of input of the reference clock input to the phase comparator 11. For example, it can be configured that a 5PPS signal synchronized with a 1PPS signal can be generated by an upsampling filter or a frequency converter so that the 5PPS signal is input to the phase comparator 11 as a new reference clock.

Apparatus Configuration, Etc.

Furthermore, as for the processes explained in the embodiments, processing procedures, control procedures, specific names, and information including various data and parameters (e.g., the phase difference and the frequency of generated output clock illustrated in FIG. 1) that are described above or illustrated in the drawings can be arbitrarily changed unless otherwise specified.

Moreover, the components of the clock generating apparatuses illustrated in FIGS. 2, 4, 5, and 7 are functionally conceptual components, and do not always have to be physically configured as illustrated in the drawings. Namely, the specific form of dispersion/integration of the components is not limited to those illustrated in the drawings, and as described below, all or part of the components can be functionally or physically dispersed or integrated in arbitrary units depending on various loads or use conditions.

For example, in FIG. 2, the oscillator 15a can be integrated into the oscillator 15b; in FIG. 4, the internal high-precision oscillator 14 can be separated from the clock generating apparatus 10; in FIG. 5, the internal high-precision oscillator 14 can be integrated into the internal high-precision oscillator 21; and in FIG. 7, the frequency counter 18, the CIC filter 19, the period calculating unit 20, the internal high-precision oscillator 21, and the pulse signal generator 22 can be integrated and configured as a frequency converter.

Clock Generating Program

All or any part of functions of processing performed in the clock generating apparatus 10 (e.g., upsampling of a phase difference by the CIC filter 12) are realized by a CPU, an MCU (Micro Controller Unit), an MPU (Micro Processing Unit), and programs analyzed and executed by the CPU, the MCU, and the MPU, or can be realized as hardware by wired logic.

Incidentally, the clock generating method explained in the embodiments can be realized by causing a computer, such as a personal computer or a workstation, to execute a clock generating program prepared in advance.

The clock generating program can be distributed via a network such as the Internet. Furthermore, the clock generating program can be recorded on a computer-readable recording medium, such as a hard disk, a flexible disk (FD), a CD-ROM, an MO, or a DVD, so as to be executed by being read out from the recording medium by a computer.

According to the embodiments of the present invention, the clock generating apparatus may generate output clock signals without causing a frequency of the output clock signal to fluctuate a lot.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock generating apparatus comprising:
a phase-difference measuring device that measures a difference in phase between a reference clock and a feedback clock generated by a divider by using a high-speed clock multiplied by a multiplier;
an averager that averages the phase difference measured by the phase-difference measuring device; and
an output clock generator that returns a self-generated output clock to the multiplier and the divider and generates an output clock synchronized with the reference clock by using the phase difference averaged by the averager and an operation clock generated by an internal high-precision oscillator, wherein
the multiplier generates the high-speed clock by multiplying the output clock returned from the output clock generator,
the divider generates the feedback clock by dividing the output clock returned from the output clock generator, and
the clock generating apparatus for generating an output clock synchronized with the reference clock, further comprises a first frequency increasing unit that increases a frequency of generation of the output clock in the output clock generator.

2. The clock generating apparatus according to claim 1, wherein the first frequency increasing unit upsamples the phase difference measured by the phase-difference measuring device thereby increasing a frequency of input of the phase difference input from the phase-difference measuring device to the averager.

3. The clock generating apparatus according to claim 1, wherein the first frequency increasing unit upsamples the phase difference averaged by the averager thereby increasing a frequency of input of the averaged phase difference input from the averager to the output clock generator.

4. The clock generating apparatus according to claim 1, further comprising:
a period converting unit that converts a period of the reference clock into a period of the operation clock generated by the internal high-precision oscillator;
a second frequency increasing unit that upsamples a result of conversion by the period converting unit thereby increasing a frequency of input of the result of conversion input to a period calculating unit to a predetermined constant multiple, the period calculating unit dividing the result of conversion of which the frequency of input is increased by the second frequency increasing unit by a predetermined constant thereby calculating a period of a new reference clock; and
a pulse-signal generating unit that generates a pulse signal from the operation clock generated by the internal high-precision oscillator with each period of the new reference clock calculated by the period calculating unit, wherein
the phase-difference measuring device measures a difference in phase between the pulse signal generated by the pulse-signal generating unit and the feedback clock generated by the divider.

5. The clock generating apparatus according to claim 1, further comprising:
a period converting unit that converts a period of the reference clock into a period of the operation clock generated by the internal high-precision oscillator;
a period calculating unit that divides a result of conversion by the period converting unit by a predetermined constant thereby calculating a period of a new reference clock; and
a third frequency increasing unit that upsamples the period of the new reference clock calculated by the period calculating unit thereby increasing a frequency of input of the period of the new reference clock input to a pulse-signal generating unit to a predetermined constant multiple, the pulse-signal generating unit generating a pulse signal from the operation clock generated by the internal high-precision oscillator with each period of the new reference clock calculated by the period calculating unit based on the result of conversion of which the frequency of input is increased by the third frequency increasing unit, wherein
the phase-difference measuring device measures a difference in phase between the pulse signal generated by the pulse-signal generating unit and the feedback clock generated by the divider.

6. The clock generating apparatus according to claims 1, wherein the first frequency increasing unit comprises a cascade integrate comb filter.

7. An electronic apparatus that comprising:
a phase-difference measuring device for measuring a difference in phase between a reference clock and a feedback clock generated by a divider by using a high-speed clock multiplied by a multiplier;
an averager for averaging the phase difference measured by the phase-difference measuring device; and
an output clock generator that returns a self-generated output clock to the multiplier and the divider and generates an output clock synchronized with the reference clock by using the phase difference averaged by the averager and an operation clock generated by an internal high-precision oscillator, wherein
the multiplier generates the high-speed clock by multiplying the output clock returned from the output clock generator,
the divider generates the feedback clock by dividing the output clock returned from the output clock generator, and
the electronic apparatus for performing each process with the output clock generated by the output clock generator, further comprises a first frequency increasing unit that increases a frequency of generation of the output clock in the output clock generator.

8. A clock generating method for generating an output clock synchronized with a reference clock comprising:

measuring a difference in phase between the reference clock and a feedback clock generated by a divider by using a high-speed clock multiplied by a multiplier;

averaging the phase difference measured by a phase-difference measuring device;

generating an output clock synchronized with the reference clock by using the averaged phase difference and an operation clock generated by an internal high-precision oscillator; and increasing a frequency of generation of the output clock, wherein the high-speed clock is generated by multiplying the output clock;

the feedback clock is generated by dividing the output clock.

9. The clock generating method according to claim 8, wherein the increasing includes upsampling the phase difference thereby increasing a frequency of the averaging.

10. The clock generating method according to claim 8, wherein the increasing includes upsampling the phase difference averaged by the averaging thereby increasing a frequency of the generating the output clock.

11. The clock generating method according to claim 8, further comprising:

converting a period of the reference clock into a period of the operation clock generated by the internal high-precision oscillator;

calculating a period of a new reference clock by dividing a result of the converting;

upsampling the result of converting thereby increasing a frequency of the calculating the period of the new reference clock;

generating a pulse signal from the operation clock generated by the internal high-precision oscillator with each period of the new reference clock; and measuring a difference in phase between the pulse signal and the feedback clock generated by the divider.

12. The clock generating method according to claim 8, further comprising:

converting a period of the reference clock into a period of the operation clock generated by the internal high-precision oscillator;

calculating a period of a new reference clock by dividing a result of the converting by a predetermined constant;

generating a pulse signal from the operation clock generated by the internal high-precision oscillator with each period of the new reference clock based on the result of the converting;

upsampling the period of the new reference clock calculated by a period calculating unit thereby increasing a frequency of generating the pulse signal to a predetermined constant multiple; and measuring a difference in phase between the pulse signal generated and the feedback clock generated by the divider.

\* \* \* \* \*